United States Patent [19]
Lin et al.

[11] Patent Number: 6,083,783
[45] Date of Patent: Jul. 4, 2000

[54] METHOD OF MANUFACTURING COMPLEMENTARY METALLIC-OXIDE-SEMICONDUCTOR

[75] Inventors: Tony Lin, Kaohsiung Hsien; Wen-Kuan Yeh, Chupei; Jenn Tsao, Taipei, all of Taiwan

[73] Assignee: United Microelectronics Corp., Taipei, Taiwan

[21] Appl. No.: 09/094,053

[22] Filed: Jun. 9, 1998

[30] Foreign Application Priority Data

Apr. 22, 1998 [TW] Taiwan .................................. 87106143

[51] Int. Cl.[7] ................................................ H01L 21/8238
[52] U.S. Cl. ............................ 438/199; 438/231; 438/305
[58] Field of Search ................................. 438/231, 232, 438/305, 306, 199

*Primary Examiner*—Jey Tsai
*Assistant Examiner*—Christopher Lattin
*Attorney, Agent, or Firm*—Thomas, Kayden, Horstemeyer & Risley

[57] ABSTRACT

A method of manufacturing a complementary metal-oxide-semiconductor that utilizes a slight change in the patterned photoresist layer for forming the lightly doped drain structure of an NMOS and the halo implantation region during CMOS fabrication. By forming a photoresist layer that exposes the p-well region where a well pickup structure is to be formed, the distance between the photoresist layer and the gate is increased, thereby eliminating the restrictions imposed upon the tilt angle in a halo implantation. Later, the lightly doped n-type impurities in the well pickup region can be compensated for by the p-type impurity implantation when the PMOS source/drain regions are formed. Hence, the lightly doped n-type well pickup region can be reverted to a p-type impurity doped region.

18 Claims, 6 Drawing Sheets

METHOD OF MANUFACTURING COMPLEMENTARY METALLIC-OXIDE-SEMICONDUCTOR

CROSS-REFERENCE TO RELATED APPLICATION

This application claims the priority benefit of Taiwan application serial no. 87106143, filed Apr. 22, 1998, the full disclosure of which is incorporated herein by reference.

BACKGROUND OF THE INVENTION

1. Field of Invention

The present invention relates to a method of manufacturing integrated circuits. More particularly, the present invention relates to a method of manufacturing a complementary metal-oxide-semiconductor (CMOS).

2. Description of Related Art

Metal-oxide-semiconductor (MOS) transistors are now one of the most widely used type of semiconductor devices in VLSI circuits. MOS devices can be further classified into n-channel MOS or NMOS, p-channel MOS or PMOS and complementary MOS (CMOS), wherein NMOS is still the most frequently used device type. However, as the level of integration for semiconductor devices continues to increase, NMOS devices are gradually being replaced by CMOS devices. This is because a CMOS device consumes less power and hence generates less heat than an NMOS device. Low power consumption and low heat generation make a CMOS device more stable and more reliable.

FIGS. 1A through 1F are cross-sectional views showing the progression of manufacturing steps in producing a conventional P-well CMOS. First, as shown in FIG. 1A, a p-well 102 is formed in an n-type substrate 100. Thereafter, a field oxide region 104 is formed over the substrate 100. The field oxide region 104 is used to separate the portion of the p-well where an NMOS transistor is to be formed from the portion of the n-type substrate 100 where a PMOS transistor is to be formed.

In the subsequent step, an NMOS transistor gate 106 and a PMOS transistor gate 108 are formed above the p-well 102 and the silicon substrate 100, respectively. Then, a photoresist layer 110 is deposited over the portion of the n-type substrate where the PMOS is to be formed, the field oxide region 104 and the region in the p-well where a well pickup structure 111 is to be formed. Next, a low-concentration n-type impurity implantation 112 is carried out using the photoresist layer 110 and the gate 106 as masks. Hence, lightly doped NMOS source/drain regions 114 and 116 are formed.

Next, as shown in FIG. 1B, again using the photoresist layer 110 and the gate 106 as masks, a low-concentration p-type impurity implantation 118 is carried out at a tilt angle θ. Ultimately, a halo region 120 is formed underneath the NMOS source/drain regions 114 and 116. The halo region 120 is capable of reducing device punch-through.

Next, as shown in FIG. 1C, the photoresist layer 110 is removed, and then sidewall spacers 122 and 124 are formed on the sidewalls of the gates 106 and 108.

Next, as shown in FIG. 1D, another photoresist layer 126 is formed over the substrate 100. This photoresist layer 126 covers the portion of the n-type substrate 100 were the PMOS is to be formed, the field oxide region 104 and the portion of the p-well 102 where the well pickup structure 111 is to be formed. Subsequently, using the photoresist layer 126, the gate 106 and sidewall spacers 122 as masks, a high-concentration n-type impurity implantation 128 is carried out. Ultimately, heavily doped NMOS source/drain regions 130 are formed.

Thereafter, as shown in FIG. 1E, the photoresist layer 126 is removed, and then another photoresist layer 132 is deposited over the substrate 100. The photoresist layer 132 exposes portion of the substrate 100 where the PMOS is to be formed and portion of the p-well 102 where the well pickup structure 111 is to be formed. Subsequently, using the photoresist layer 132, the gate 108 and the sidewall spacers 124 as masks, a high-concentration p-type impurity implantation 134 is carried out. Therefore, heavily doped PMOS source/drain regions 138 are formed in the n-type substrate 100, and at the same time well pickup region 136 is formed in the p-well 102.

Finally, as shown in FIG. 1F, the photoresist layer 132 is removed to complete the CMOS fabrication.

As the level of integration for CMOS devices increases, the aforementioned method of fabricating the p-well of a CMOS encounters some problems. One such problem arises when the halo implantation 118 is carried out. Since the photoresist layer 110 has a thickness 140 of more than about 13000 Å and the distance 142 between the gate 106 and the photoresist layer 110 is only about 4000 Å due to the need to cover the well pickup region, maximum tilt angle θ for carrying out ion implantation must be reduced from about 30° to 15° or lower. In the worse case, when factors such as alignment errors result from alignment accuracy and critical dimensions of the device, the restrictions may be so severe that it is impossible to form the halo region 120. Hence, device punch-through can become a serious problem for the device.

In light of the foregoing, there is a need to provide an improved method of fabricating CMOS devices.

SUMMARY OF THE INVENTION

Accordingly, the present invention is to provide a method of manufacturing a complementary metal-oxide-semiconductor that can produce a halo implantation region in spite of an increased level of device integration.

To achieve these and other advantages and in accordance with the purpose of the invention, as embodied and broadly described herein, the invention provides a method of manufacturing a complementary metal-oxide-semiconductor. The method utilizes a slight change in the patterned photoresist layer for forming the lightly doped drain structure of an NMOS and the halo implantation region during CMOS fabrication. By forming a photoresist layer that exposes the portion of the p-well where the well pickup region is to be formed, the distance between the photoresist layer and the gate is increased, thereby eliminating the restrictions imposed upon the tilt angle θ in a halo implantation. In a subsequent step, when a second patterned photoresist layer is deposited over the substrate to form the heavily doped region of the NMOS transistor, the well pickup region is covered. Consequently, highly concentrated n-type ions are unable to penetrate through the second patterned photoresist layer and are trapped in the well pickup region during a second implantation. Later, the lightly doped n-type impurities in the well pickup region can be compensated for by the p-type impurity implantation when the PMOS source/drain regions are formed. Hence, the lightly doped n-type well pickup region can be reverted to a p-type impurity doped region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
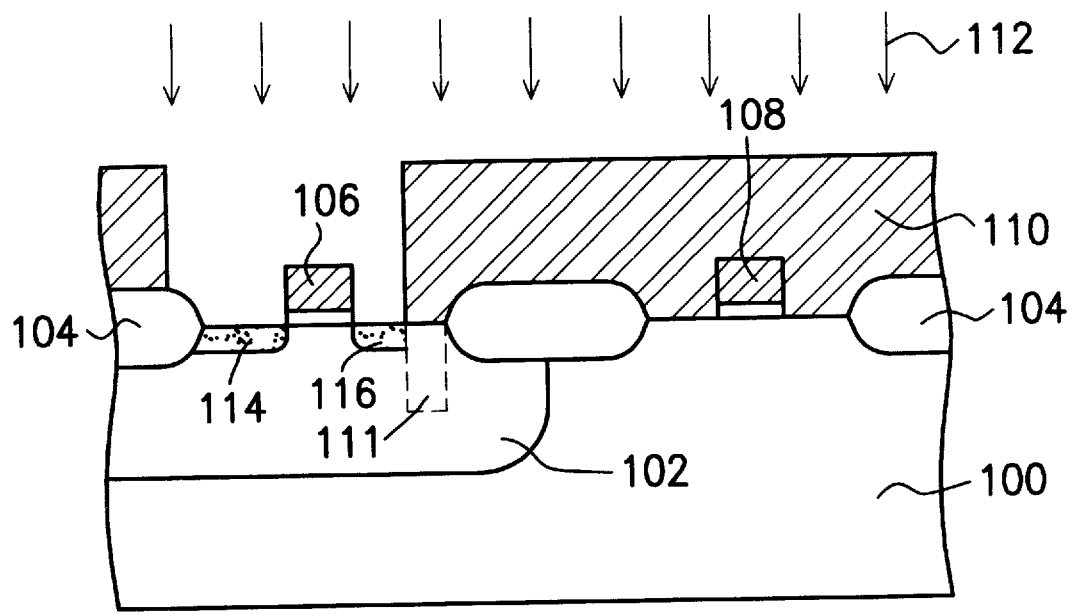
FIGS. 1A through 1F are cross-sectional views showing the progression of manufacturing steps in producing a conventional p-well CMOS.
Figure 1B:
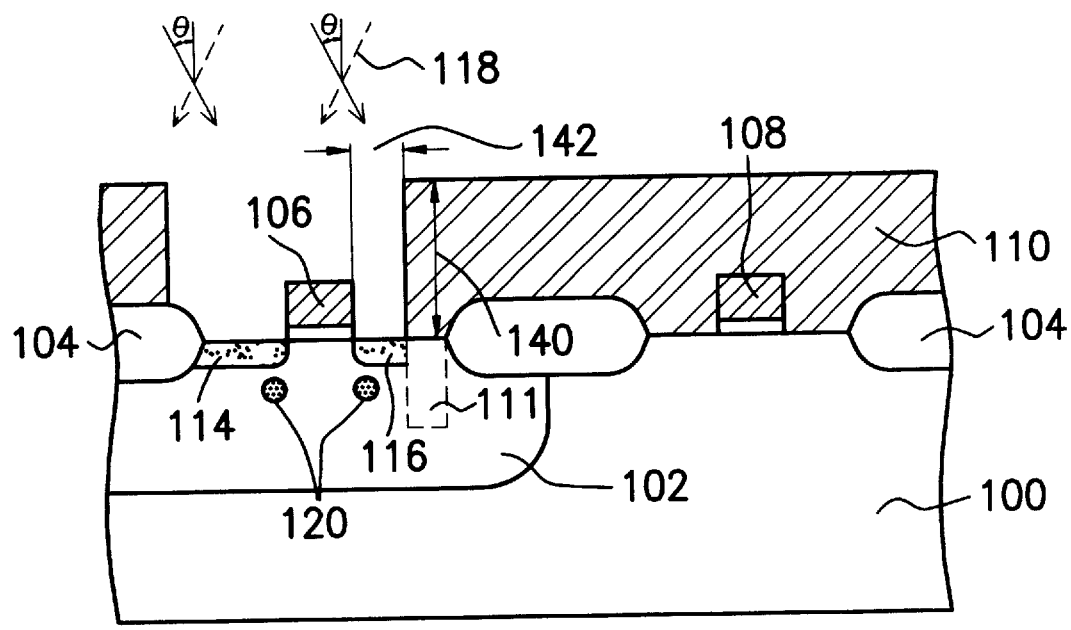
Figure 1C:
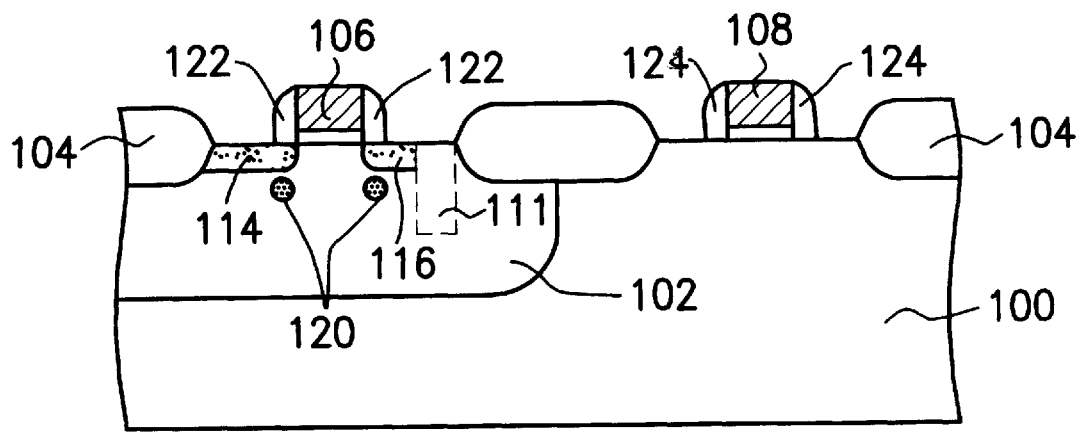
Figure 1D:
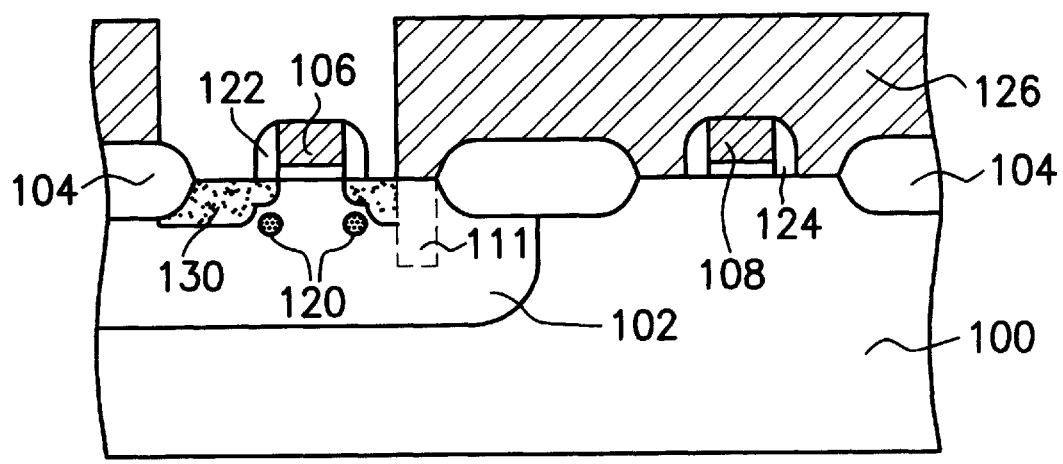
Figure 1E:
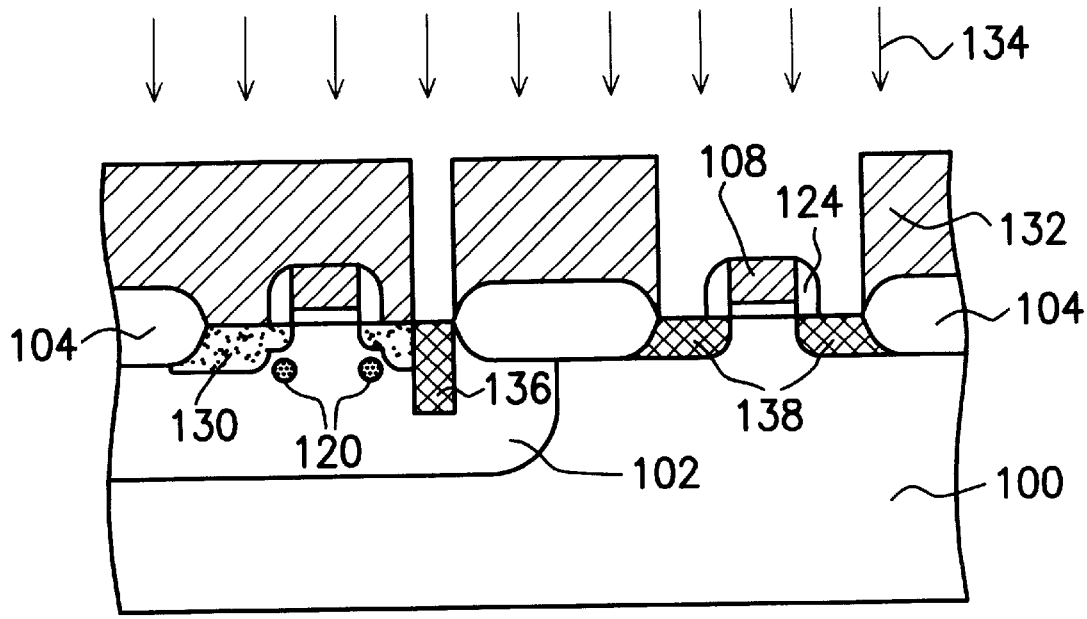
Figure 1F:
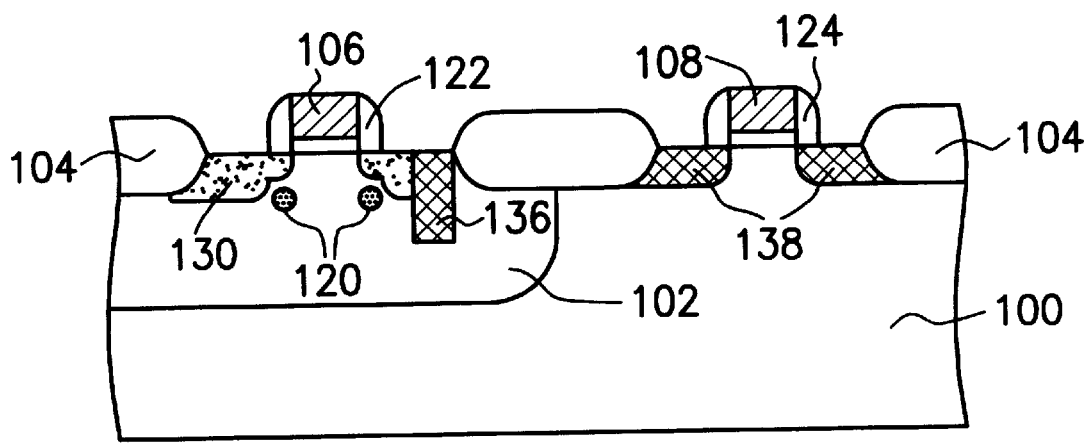

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are cross-sectional views showing the progression of manufacturing steps in producing a p-well CMOS according to one preferred embodiment of this invention.

Figure 2A:
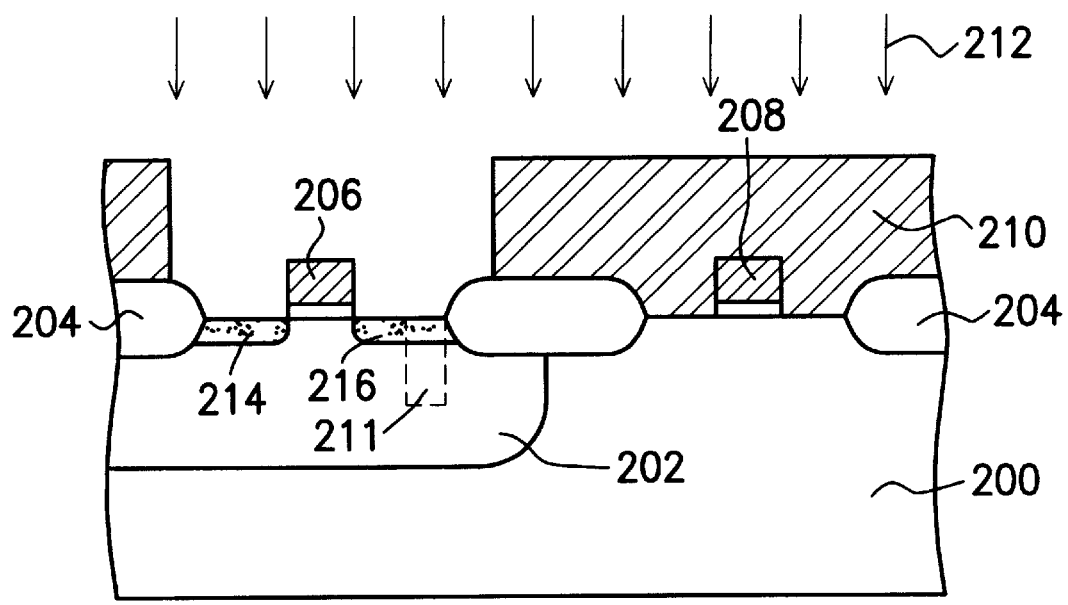
FIGS. 2A through 2F are cross-sectional views showing the progression of manufacturing steps in producing a p-well CMOS according to one preferred embodiment of this invention.

First, as shown in FIG. 2A, an n-type substrate 200, for example, an n-doped silicon substrate, is provided. Then, an impurities diffusion method or ion implantation method is used to form a p-well 202 in the n-type silicon substrate 200. Next, an isolating region 204 is formed on the substrate 200 separating the portion of the p-well where an NMOS transistor is to be formed from the portion of the n-type substrate 200 where a PMOS transistor is to be formed. The isolating region 204 can be a field oxide layer formed by a local oxidation of silicon (LOCOS) method. Alternatively, the isolating region 204 can be a shallow trench formed by a shallow trench isolation (STI) method. Subsequently, an NMOS gate 206 and a PMOS gate 208 are formed above the p-well 202 and the n-type substrate 200, respectively.

Thereafter, a photoresist layer 210 is formed over the substrate 200. The photoresist layer 210 exposes the p-well 202 and the well pickup region 211 where the NMOS transistor and the well pickup structure are to be formed. Next, using the photoresist layer 210 and the gate 206 as masks, a low-concentration n-type ion implantation 212 is carried out to form lightly doped NMOS source/drain regions 214 and 216. The implantation 212 can be performed using phosphorus ions having a low dosage, for example.

Figure 2B:
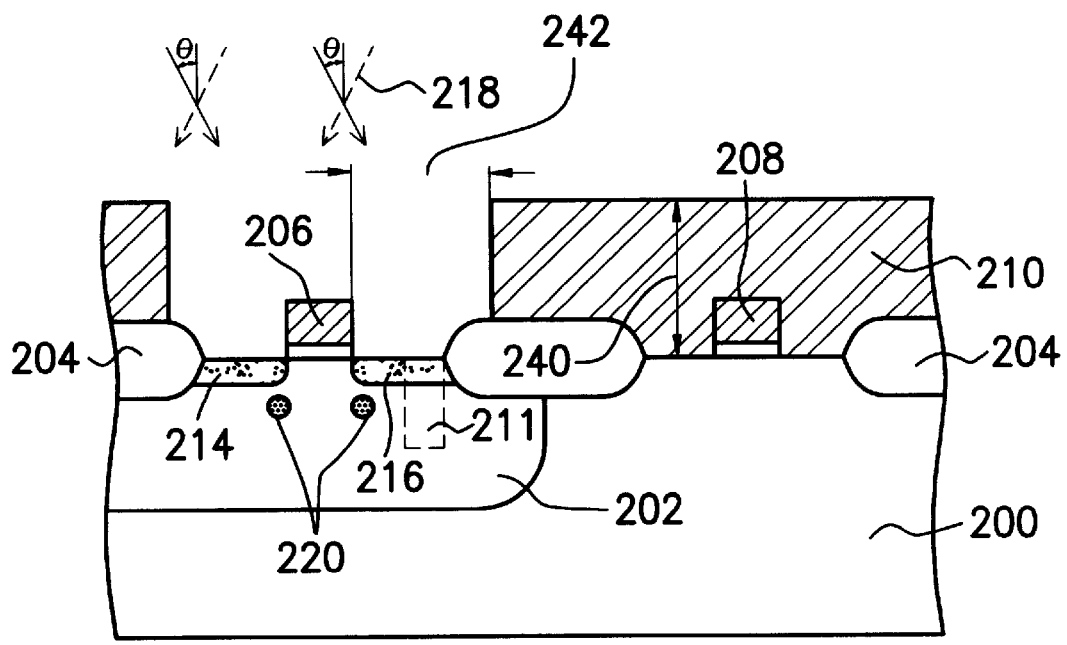

Next, as shown in FIG. 2B, using the photoresist layer 210 and the gate 206 as masks, a low-concentration p-type impurity implantation 218 is carried out at a tilt angle θ. Hence, an NMOS halo region 220 is formed below the lightly doped source/drain regions 214 and 216 to reduce current leakage. Boron ions having a low dosage can be used in the implantation 218, for example. Since the photoresist layer 210 does not cover the well pickup region 211 in the p-well 202, distance 242 between the gate 206 and the photoresist layer 210 is increased. Hence, although thickness 240 of the photoresist layer 210 can be as big as 13000 Å, implantation at a tilt angle θ to form the halo implantation region is still possible.

Figure 2C:
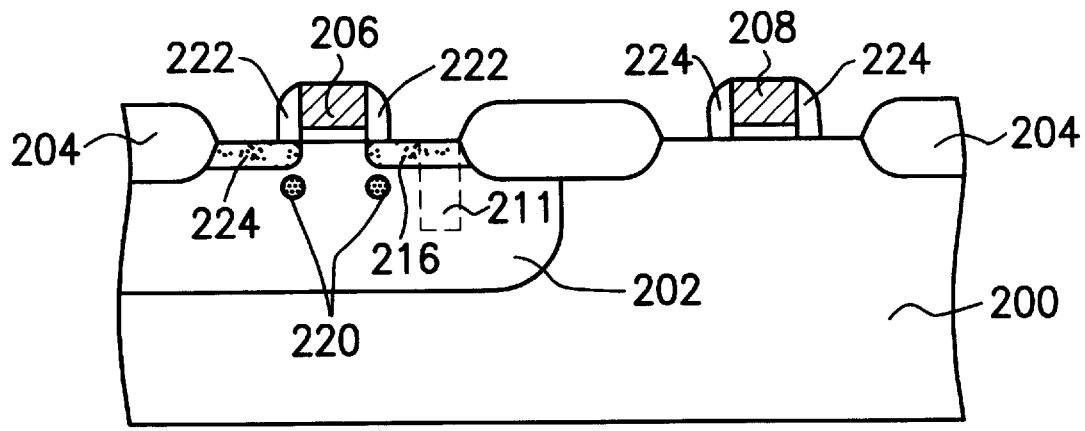

Next, as shown in FIG. 2C, the photoresist layer 210 is removed, and then sidewall spacers 222 and 224 are formed on the sidewalls of the gates 206 and 208.

Figure 2D:
Figure 2D:
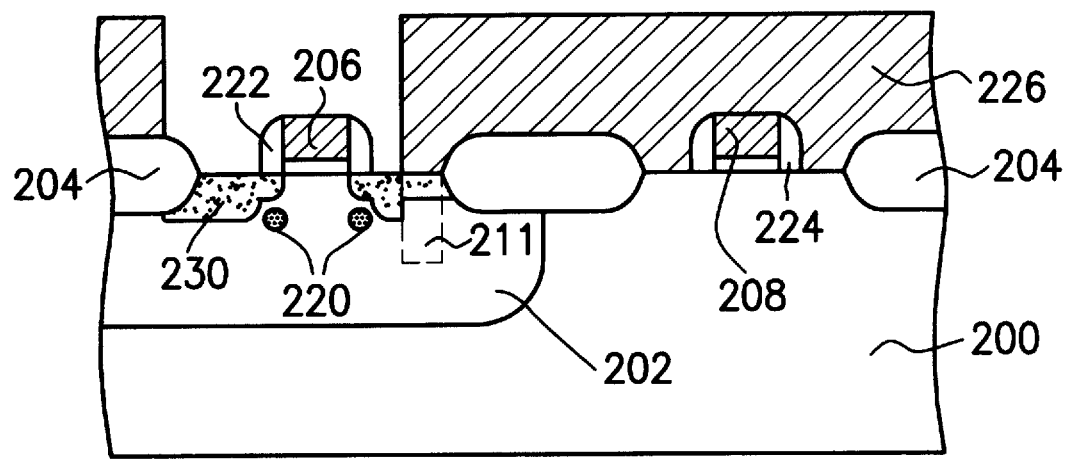

Next, as shown in FIG. 2D, another photoresist layer 226 is formed over the substrate 100. This photoresist layer 226 exposes a portion of the p-well 202 where the NMOS is to be formed, but covers the region in the p-well where the well pickup region 211 is to be formed. Subsequently, using the photoresist layer 226, the gate 206 and sidewall spacers 222 as masks, a high-concentration n-type impurity implantation 228 is carried out. Ultimately, heavily doped NMOS source/drain regions 230 are formed. Arsenic ions having a low dosage level can be use in the implantation 228, for example.

Figure 2E:
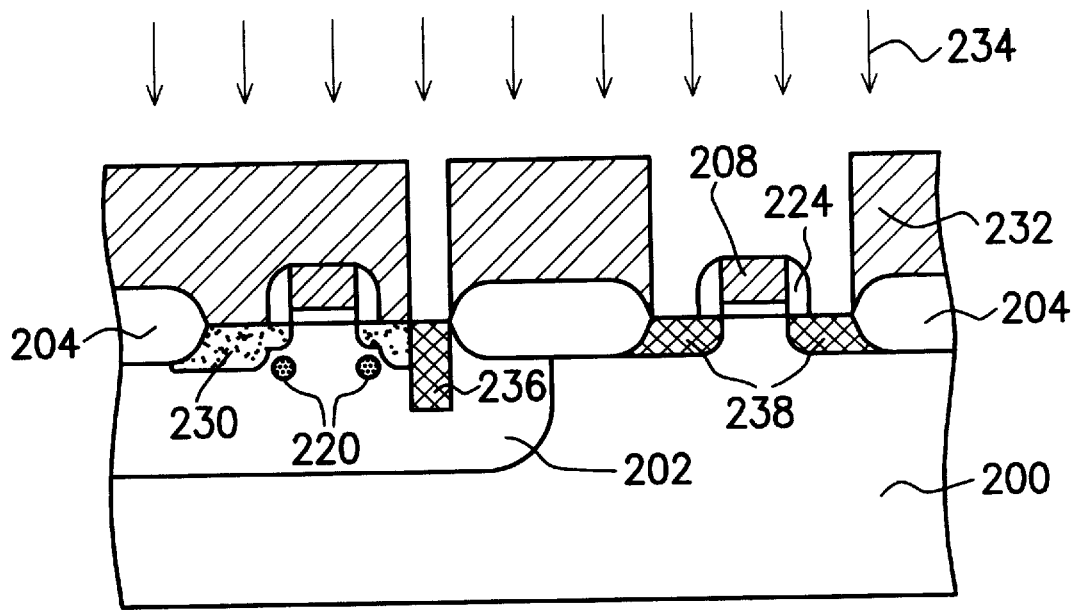

Thereafter, as shown in FIG. 2E, the photoresist layer 226 is removed, and then another photoresist layer 232 is deposited over the substrate 200. The photoresist layer 232 exposes a portion of the substrate 100 where the PMOS is to be formed and a portion of the p-well 102 where the well pickup structure 211 is to be formed. Subsequently, using the photoresist layer 232, the gate 208 and the sidewall spacers 224 as masks, a high-concentration p-type impurity implantation 234 is carried out. Therefore, heavily doped PMOS source/drain regions 238 are formed in the n-type substrate 200, and at the same time well pickup region 236 is formed in the p-well 202. Boron ions having a high dosage level can be used in the implantation 234, for example. The lightly doped n-type impurities in the well pickup region 211 implanted earlier can be compensated for by the p-type impurity implantation when the PMOS source/drain regions are formed. Consequently, the well pickup region 211 is transformed back to a p-type impurity doped well pickup region 236.

Figure 2F:
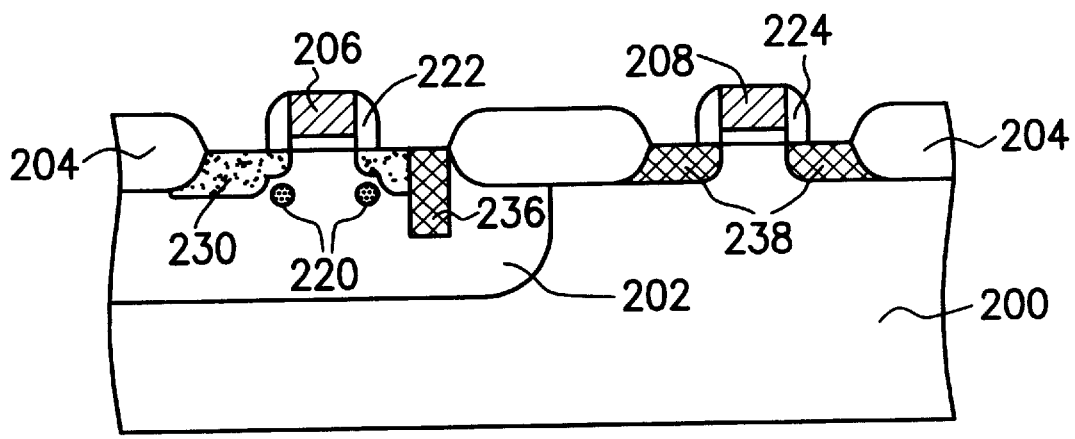

Finally, as shown in FIG. 2F, the photoresist layer 232 is removed to complete the CMOS fabrication.

Although an n-type substrate and a p-type well are used in the above description of the embodiment, anyone familiar with semiconductor technologies will understand that the same invention can be applied to a p-type substrate and an n-type well.

In summary, this invention utilizes a slight change in the patterned photoresist layer over the substrate to form the lightly doped drain structure of an NMOS and the halo implantation region during CMOS fabrication. By exposing the region in the p-well where the well pickup region forms, the distance between the photoresist layer and the gate is increased. Therefore, restrictions imposed upon the tilt angle during halo implantation are relaxed, and problems facing fabrication of the halo implantation region as the level of integration is increased can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a complementary metal-oxide-semiconductor (CMOS) transistor on a substrate, wherein the substrate has a well region, a first field effect transistor (FET) is formed on the substrate, and a second field effect transistor (FET) and a well pickup structure are formed on the well region, the method comprising the steps of:

forming a first FET gate over the substrate and forming a second FET gate over the well region;

forming a first photoresist layer over the substrate and exposing the well region where the second FET and the well pickup structure is to be formed;

performing a first ion implantation using the first photoresist layer and the second FET gate as masks, and forming a plurality of lightly doped source/drain regions on the periphery of the second FET gate;

performing an ion implantation at a tilt angle again using the first photoresist layer and the second FET gate as masks, and forming a halo implantation region in the well region;

removing the first photoresist layer;

forming first spacers on the sidewalls of the first FET gate and second spacers on the sidewalls of the second FET gate;

forming a second photoresist layer over the substrate, exposing the well region where the second FET is to be formed but covering the well pickup structure;

performing a second ion implantation to form a plurality of first heavily doped source/drain regions on the periphery of the second spacers;

removing the second photoresist layer;

forming a third photoresist layer over the substrate and exposing a portion of the substrate where the first FET is to be formed and a portion of the well region where the well pickup structure is to be formed;

performing a third ion implantation to form a plurality of second heavily doped source/drain regions on the periphery of the first spacers as well as the well pickup structure in the well region; and removing the third photoresist layer.

2. The method of claim 1, wherein the substrate includes an n-type semiconductor and the well region includes a p-type well region.

3. The method of claim 2, wherein the step of performing the first ion implantation and the second ion implantation includes implanting n-type ions.

4. The method of claim 3, wherein the step of implanting n-type ions includes implanting phosphorus.

5. The method of claim 3, wherein the step of implanting n-type ions includes implanting arsenic.

6. The method of claim 2, wherein the step of performing ion implantation at a tilt angle includes implanting p-type ions.

7. The method of claim 6, wherein the step of performing ion implantation at a tilt angle includes implanting boron.

8. The method of claim 2, wherein the step of performing the third ion implantation includes implanting p-type ions.

9. The method of claim 8, wherein the step of performing the third ion implantation includes implanting boron.

10. The method of claim 1, wherein the substrate includes a p-type semiconductor and the well region includes an n-type well.

11. The method of claim 10, wherein the step of performing the first ion implantation and the second ion implantation includes implanting p-type ions.

12. The method of claim 10, wherein the step of performing ion implantation at a tilt angle includes implanting n-type ions.

13. The method of claim 10, wherein the step of performing the third ion implantation includes implanting n-type ions.

14. A method of manufacturing a complementary metal-oxide-semiconductor (CMOS) transistor on an n-type semiconductor substrate, wherein the n-type semiconductor substrate has a p-type well region, a p-channel field effect transistor (FET) is formed on the n-type semiconductor substrate, and an n-channel field effect transistor (FET) and a well pickup structure are formed on the p-well region, the method comprising the steps of:

forming a p-channel FET gate over the n-type semiconductor substrate and forming an n-channel FET gate over the p-well region;

forming a first photoresist layer over the n-type semiconductor substrate and exposing the p-well region where the n-channel FET and the well pickup structure is to be formed;

performing a first n-type ion implantation using the first photoresist layer and the n-channel FET gate as masks, and forming a plurality of n-type lightly doped source/drain regions in the p-well on the periphery of the n-channel FET gate;

performing a p-type ion implantation at a tilt angle again using the first photoresist layer and the n-channel FET gate as masks, and forming a halo implantation region in the p-well region;

removing the first photoresist layer;

forming first spacers on the sidewalls of the p-channel FET gate and second spacers on the sidewalls of the n-channel FET gate;

forming a second photoresist layer over the n-type semiconductor substrate and exposing the p-well region where the n-channel FET is to be formed but covering the well pickup structure;

performing a second n-type ion implantation to form a plurality of n-type heavily doped source/drain regions on the periphery of the second spacers;

removing the second photoresist layer;

forming a third photoresist layer over the substrate and exposing a portion of the n-type semiconductor substrate where the p-channel FET is to be formed and a portion of the p-well region where the well pickup structure is to be formed;

performing a p-type ion implantation to form a plurality of p-type heavily doped source/drain regions on the periphery of the first spacers as well as the well pickup structure in the p-well region; and removing the third photoresist layer.

15. The method of claim 14, wherein the step of performing the first n-type ion implantation includes implanting phosphorus.

16. The method of claim 14, wherein the step of performing p-type ion implantation at a tilt angle includes implanting boron.

17. The method of claim 14, wherein the step of performing the second n-type ion implantation includes implanting arsenic.

18. The method of claim 14, wherein the step of performing the p-type ion implantation includes implanting boron.

\* \* \* \* \*